United States Patent
Ohlwine et al.

(10) Patent No.: US 6,362,953 B1
(45) Date of Patent: Mar. 26, 2002

(54) CONTROL DEVICE ASSEMBLY

(75) Inventors: Brian S. Ohlwine, Zanesville, IN (US); James B. Trevino, Liverpool, NY (US); Jason R. Close, Fort Wayne, IN (US); Richard D. Youmans, Greentown, IN (US); Jennifer L. Jenkins, Fort Wayne, IN (US)

(73) Assignee: Carrier Corporation, Syracuse, NY (US)

(*) Notice: Subject to any disclaimer, the term of this patent is extended or adjusted under 35 U.S.C. 154(b) by 0 days.

(21) Appl. No.: 09/472,612

(22) Filed: Dec. 27, 1999

(51) Int. Cl.[7] .................................................. G06F 1/16
(52) U.S. Cl. ...................... 361/681; 361/752; 361/826; 345/905; 312/223.2
(58) Field of Search ................................ 361/681, 682, 361/724–727, 752, 755, 796, 826–827; 345/169, 905; 312/223.1–223.6; 206/576, 305, 302; 235/1 D, 145 R, 146

(56) References Cited

U.S. PATENT DOCUMENTS

| | | | | |
|---|---|---|---|---|
| 5,400,055 A | * | 3/1995 | Ma et al. ..................... 345/168 |
| 5,467,106 A | * | 11/1995 | Salamon ....................... 345/87 |
| 5,568,357 A | * | 10/1996 | Kochis et al. ............... 361/681 |
| 6,031,524 A | * | 2/2000 | Kunert ........................ 345/173 |

* cited by examiner

Primary Examiner—Leo P. Picard
Assistant Examiner—Hung Van Duong

(57) ABSTRACT

A wall mounted control device such as a thermostat includes a front panel housing having a plurality of locating elements formed therein which allow the mounting of a display, a keyboard unit and a printed circuit board with respect to each other. The front panel housing includes a latch which engages an edge of the display following placement of the display into position within the front panel housing. The keyboard unit is positioned relative to the latched display. The printed circuit board is snapped into place beneath certain raised elements formed in the periphery of the front panel housing. The front panel housing with the thus assembled display, keyboard unit and printed circuit board therein is aligned and snap fitted to a rear or back housing of the wall mounted device.

15 Claims, 5 Drawing Sheets

CONTROL DEVICE ASSEMBLY

BACKGROUND OF THE INVENTION

This invention relates to the assembly of a wall mounted programmable device such as a thermostat. In particular, this invention relates to the assembly of a keyboard, a display and a printed circuit board within such a wall mounted programmable device. The mounting of keyboard and display elements relative to a printed circuit board within a programmable thermostat is extremely important since these are the elements which receive information, process information, and display information to the user of the thermostat. Various approaches have heretofore been taken to mounting these elements so that they are precisely registered relative to each other in the thermostat.

U.S. Pat. No. 4,295,180 discloses a particular approach to mounting display elements and a keyboard relative to a printed circuit board. In particular, this patent discloses a printed circuit board having display elements already mounted thereon. A keyboard includes structure which snaps over the display elements so as to physically locate the keyboard relative to the display elements. The structure which snaps over the display elements is a series of detent daggers which engage the edges of the display elements. The thus located keyboard is mounted to the printed circuit board by screws which pass through holes in the circuit board. The circuit board, including the display elements and keyboard, are furthermore snapped into a faceplate of the thermostat by detent daggers in the faceplate engaging edges of the keyboard.

The above approach to registering the keyboard, display elements and printed circuit board with respect to each other within a thermostat is a complex process requiring careful alignment of successive sets of detent daggers. It also does not completely eliminate the need to use threaded fasteners. It furthermore does not reveal how the display elements are mounted to the printed circuit board which itself could be somewhat challenging given the limited amount of area on the board for accommodating the display elements. It would be preferable to assemble the keyboard, display, and printed circuit board of a thermostat in a less complex way. It would also be preferable if the assembly could be done without employing any threaded fasteners.

SUMMARY OF THE INVENTION

The present invention provides a programmable device with a front panel housing having a plurality of locating elements formed therein which allow the mounting of a display, a keyboard unit and a printed circuit board with respect to each other. The front panel housing furthermore includes a latch which engages an edge of the display following placement of the display relative to certain locating elements formed in the front panel housing. The keyboard unit includes a plurality of depressible keys, which are inserted into specifically delineated openings within the housing. The specifically delineated openings within the housing are preferably deep walled openings that surround each depressible key for a substantial distance. The keyboard unit also preferably includes projecting tabs which extend over the display when the depressible keys are fully inserted into the delineated holes. A printed circuit board having electrically conductive pads that make electrical contact with the depressible keys of the keyboard is placed over the keyboard and registered with respect to several locating elements formed around the periphery of the front panel housing. The printed circuit board snaps into place beneath certain raised elements formed in the periphery of the front panel housing. The display is thereafter preferably connected to the printed circuit board by a ribbon cable connector.

The front panel housing with the thus assembled display, keyboard unit and printed circuit board therein is aligned and snap fitted to a rear or back housing of the programmable device. A tab on one side of the front panel housing used in the snap fitting of the front panel housing to the rear housing can preferably be displaced or moved by a tool such as a bladed screwdriver so as to disengage this tab from the rear or back housing. This allows the front panel housing and the rear panel housing to be separated once again.

BRIEF DESCRIPTION OF THE DRAWINGS

For a fuller understanding of the present invention, reference should now be made to the following detailed description thereof taken in conjunction with the accompanying drawings wherein.

DESCRIPTION OF THE PREFERRED EMBODIMENTS

Figure 1:
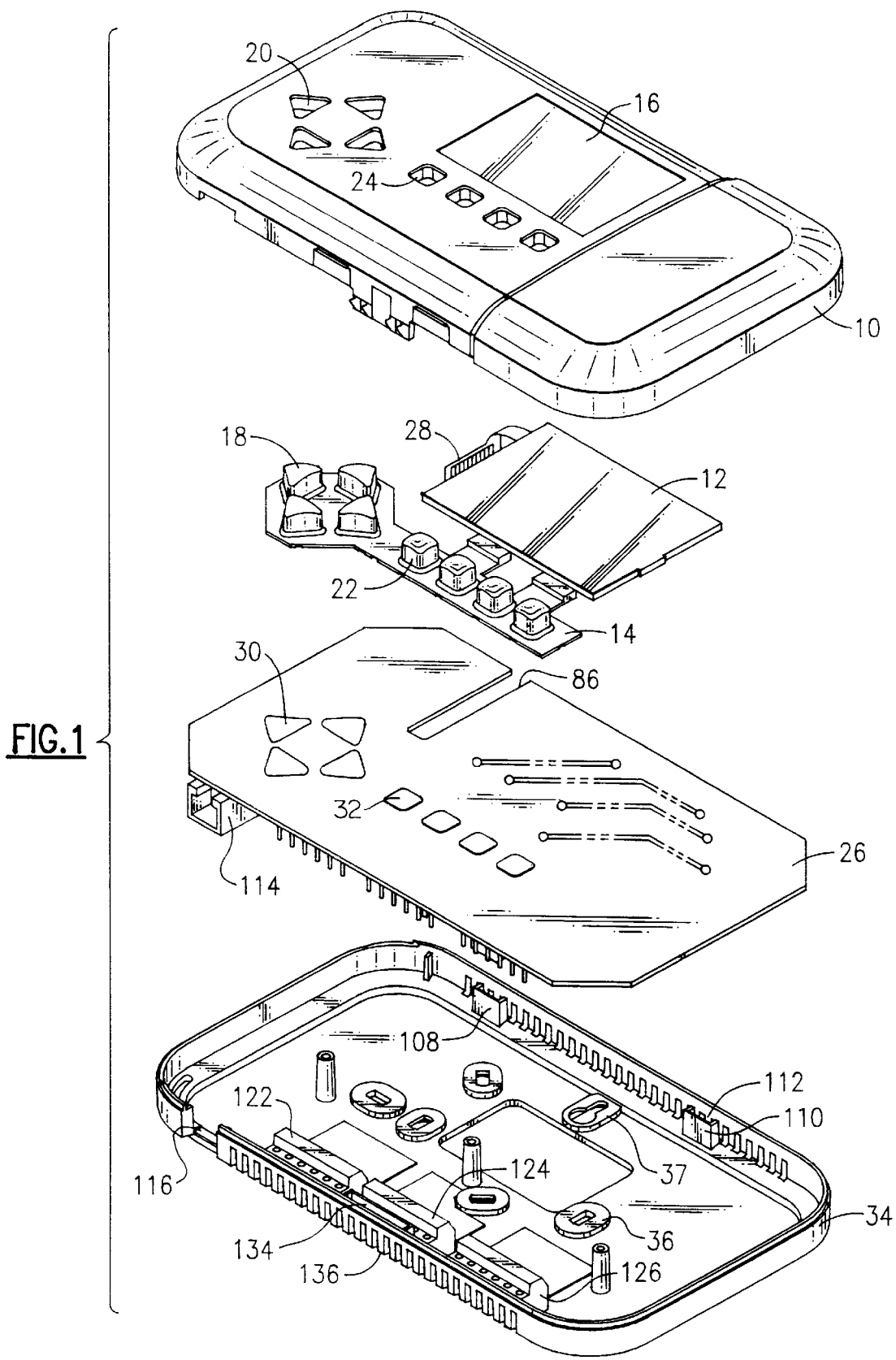
FIG. 1 is an exploded view of a programmable wall mounted control device including a front panel housing, a display element, a keyboard element, a printed circuit board element, and a back housing.

Referring to FIG. 1, a front panel housing 10 is illustrated relative to a display 12 and keyboard unit 14. The display 12 is mounted to the underside of the front panel housing 10 so as to be viewable through an opening 16. The keyboard unit 14 includes a plurality of elevated directional keys such as 18, which will be inserted into directional key holes such as 20 formed in the front panel housing 10. The keyboard unit furthermore includes elevated keys such as 22, which will be inserted into corresponding keyholes such as 24 formed in the front panel housing 10.

The display 12 is electrically connected to a printed circuit board 26 via an electrical ribbon connector 28. The printed circuit board 26 includes electrically conductive pads such as 30 and 32. As will be explained hereinafter, the bottoms of the elevated keys such as 18 and 22 (not shown in FIG. 1) will ultimately register with the electrically conductive pads such as 30 and 32 when the printed circuit board 26 is brought into registration with the front panel housing 10. As will also be explained hereafter, the front panel housing will snap fit into a rear or back housing 34 after the housing 34 is mounted to a wall via threaded fasteners in one or more of slotted holes such as 36 and 37 before the.

Figure 2:
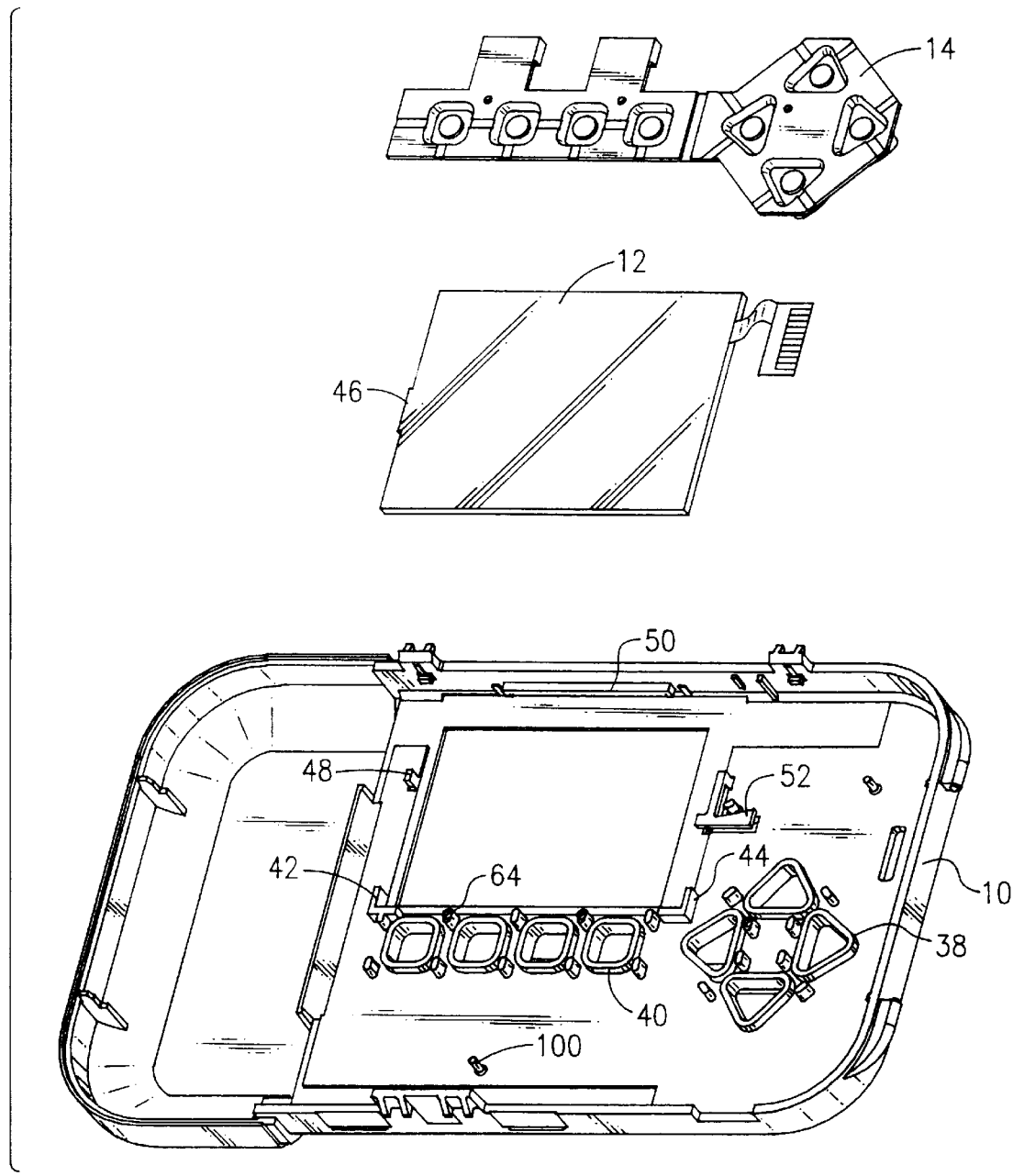
FIG. 2 is an exploded view depicting the underside of the front panel housing and the reverse sides of the display element and keyboard unit from that shown in FIG. 1.

Referring now to FIG. 2, the underside of the front panel housing 10 is illustrated relative to the display 12 and the keyboard unit 14. The underside of the front panel housing 10 is seen to include raised continuous walls, such as 38 formed under each directional keyhole such as 20, in FIG. 1. In a similar manner, raised continuous walls such as 40 are formed in the front panel housing for each keyhole, such as 24. The raised continuous walls 38 and 40 are of a sufficient height so as to allow the tops of the elevated keys to protrude slightly above the topside of the top panel housing when the keyboard unit is registered within the top panel housing.

Referring now to the display 12, it is to be noted that two corners of the display element are to be positioned within corner shaped locating projections 42 and 44 formed in the front panel housing 10. An edge of the display having a stepped contour 46 is also to be registered with respect to an edge alignment projection 48. Another edge of the display element is to be inserted underneath the legs of a shelf 50 extending inwardly from one side of the front panel housing.

Figure 3:
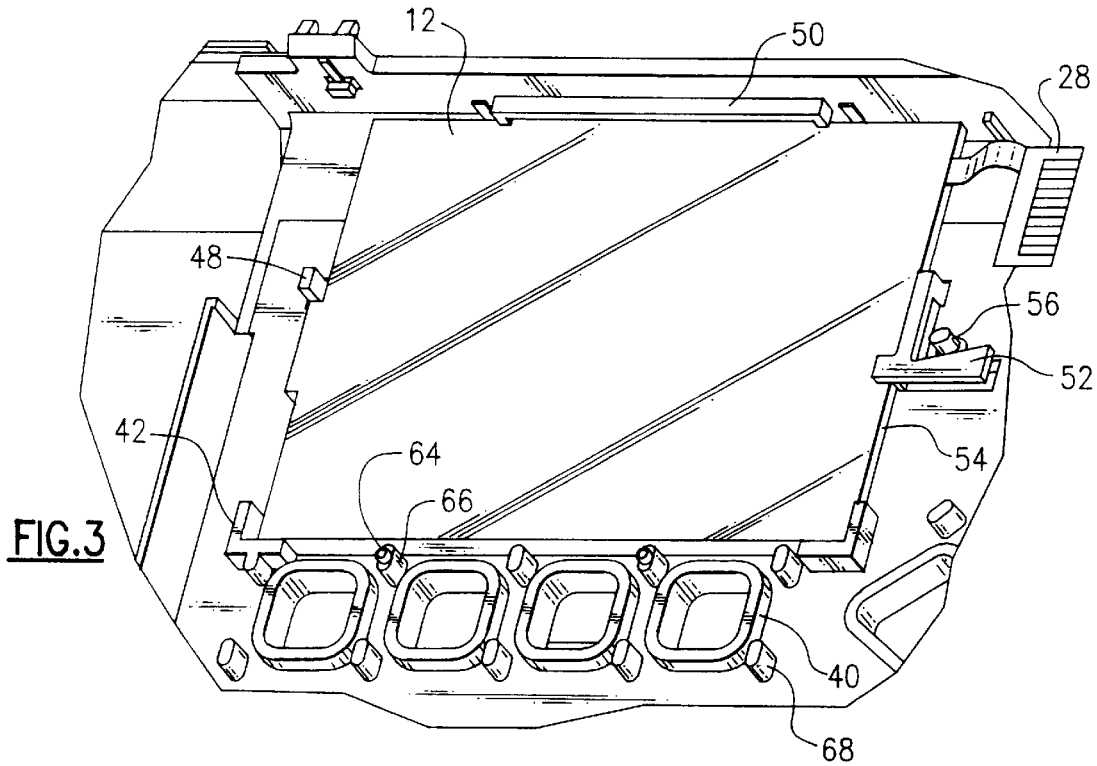
FIG. 3 illustrates the mounting of the display element with respect to the front panel housing.
Figure 4:
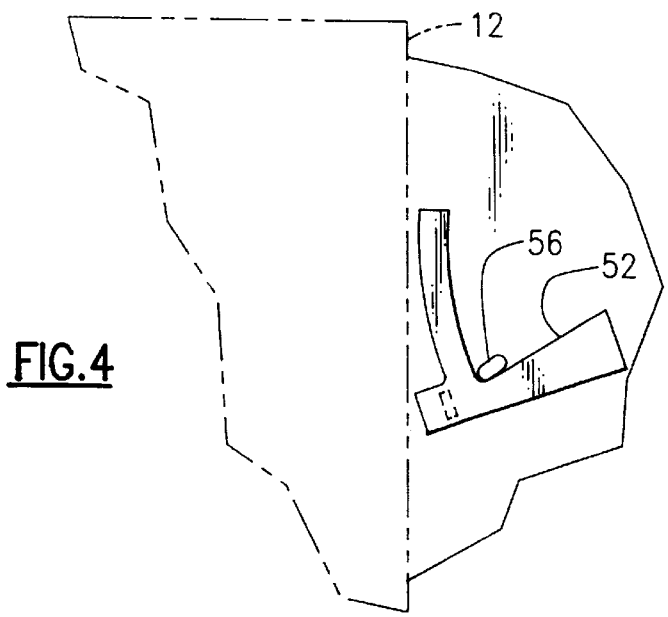
FIGS. 4 and 5 illustrate a latch used in the mounting of the display element to the front panel housing in FIG. 3.

Referring now to FIG. 3, one edge of the display 12 is shown underneath the legs of the shelf 50. Two corners of the display are also registered with respect to the corner projections 42, 44. The edge having the stepped contour 46 is also registered with respect to the edge alignment projection 48. A latch 52 is moreover illustrated in locked engagement with an edge 54 of the display 12. The latch 52 is normally biased so as to move inwardly towards engagement with the edge 54 of the display 12. The latch 52 can however be moved outwardly as shown in FIG. 4 so as to allow for insertion of the display 12 beneath the legs of the shelf 50 while being registered with respect to the corner projections 42, 44 and edge alignment projection 48. A stop 56 prevents the latch 52 from being moved too far outwardly when the display is being positioned relative to the edge alignment projection 48 and corner shaped projections 42 and 44.

Figure 5:
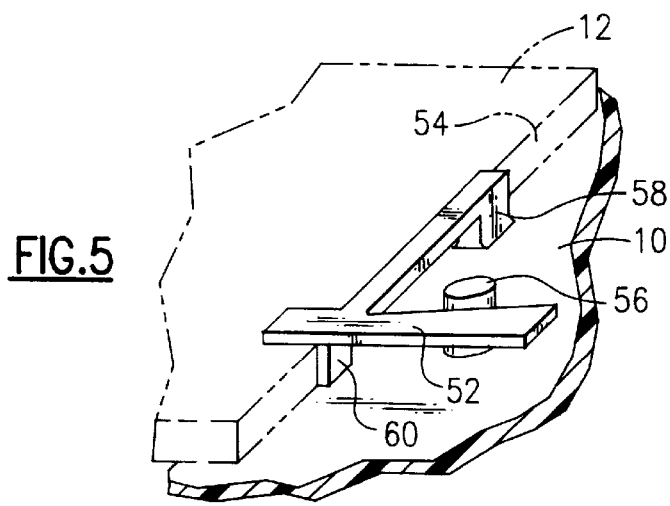

Referring now to FIG. 5, the latch 52 is illustrated in detail. The latch 52 is seen to have a post portion 58 extending upwardly from the underside of the front panel housing 10. The latch furthermore includes an L-shaped top portion having a first leg fixedly attached at one end to the post portion 58. The L-shaped portion also includes a second leg having a greater width than the width of the first leg so as to be considerably more rigid than the first leg. The width of the second leg also preferably increases as it extends outwardly away from the first leg. The second leg extends outwardly a sufficient distance so that it may be engaged at its end by a human finger. Application of force by a human finger at the end of the second leg will cause the first leg to bend as shown in FIG. 4. The post portion 58 must be sufficiently rigid to absorb the torque produced by the bending of the first leg. Referring again to FIG. 5, it is to be noted that an edge alignment tab 60 projects downwardly from the bottom of a toe in the L-shaped top portion. The toe preferably begins at the junction of the first and second legs of the L-shaped top portion. A portion of the toe extends beyond the alignment tab so as to capture the backside of the display. The edge alignment tab 60 engages the edge 54 of the display 12 when the latch 52 is allowed to freely move toward the edge 54.

Figure 6:
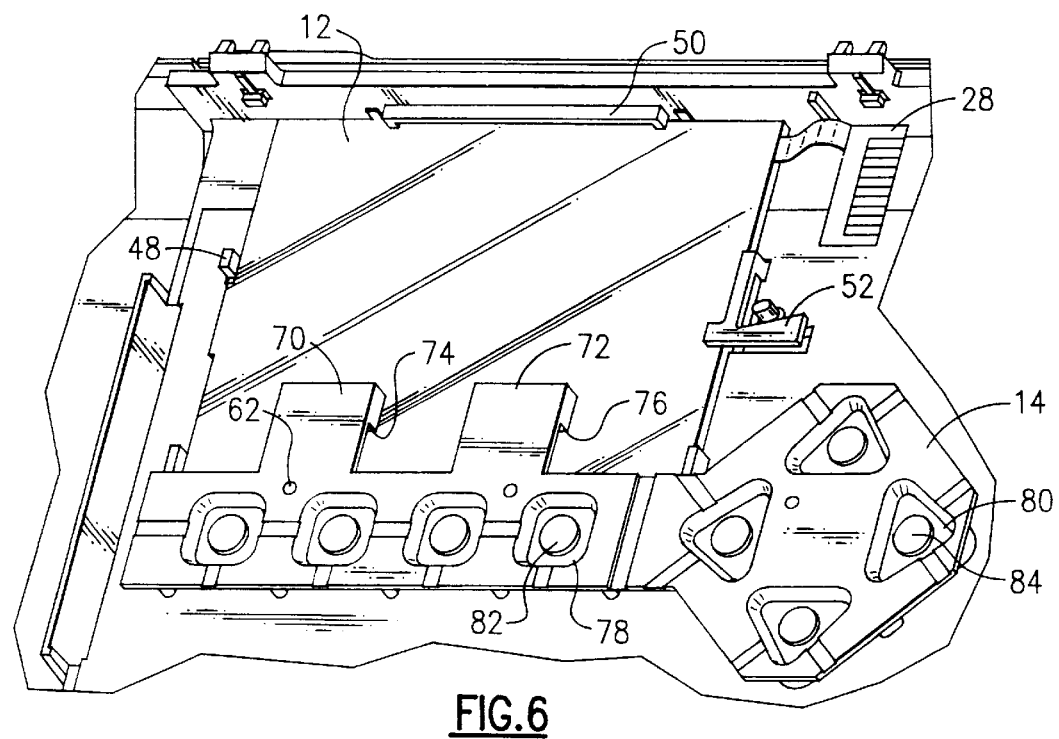
FIG. 6 illustrates the mounting of the keyboard unit with respect to the front panel housing.

Referring now to FIGS. 3 and 6, the keyboard unit 14 is seen to include several locating holes such as 62, which engage projections such as 64 extending upwardly from pillars such as 66. The upwardly extending projections 64 begin at the top surfaces of the pillars 66. The pillars such as 66 are preferably formed near the continues walls associated with openings such as 40. Supporting pillars such as 68 without the extending projections 64 are also preferably formed near the continuos walls associated with openings such as 40. The top surfaces of the pillars such as 66 are preferably in the same plane as the top surfaces of the supporting pillars 68 so as to offer support at the same level to the keyboard unit 14 when mounted on the upwardly extending projections 64.

The keyboard unit 14 is seen to include two cantilevered tabs 70 and 72 which extend outwardly over the backside of the display 12 in FIG. 6. The tabs 70 and 72 preferably have downwardly extending pads 74, which press against the back surface of the display 12 when the locating holes in the keyboard unit are positioned down over the upwardly extending projections 64.

The exposed side of the keyboard unit 14 in FIG. 6 is seen to include casings such as 78 and 80 for each of the keys of the keyboard unit. These casings are preferably elevated above the bottom surface of the keyboard unit. The ends of these elevated casings are also preferably match the shape of the electrically conductive pads such as 30 and 32 on the printed circuit board 26 of FIG. 1. The particularly shaped ends of these elevated casings are preferably non-conductive whereas the bottoms of the depressible keys within the casings such as 82 and 84 are electrically conductive. This allows the bottoms of the depressible keys to make electrical contact with the electrically conductive pads such as 30 and 32 on the printed circuit board.

Figure 8:
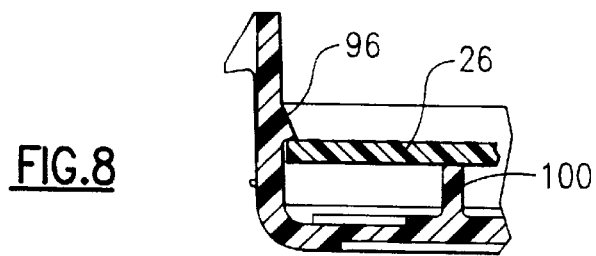
FIG. 8 is a partial cross-sectional view of the printed board mounted within the front panel housing.
Figure 7:
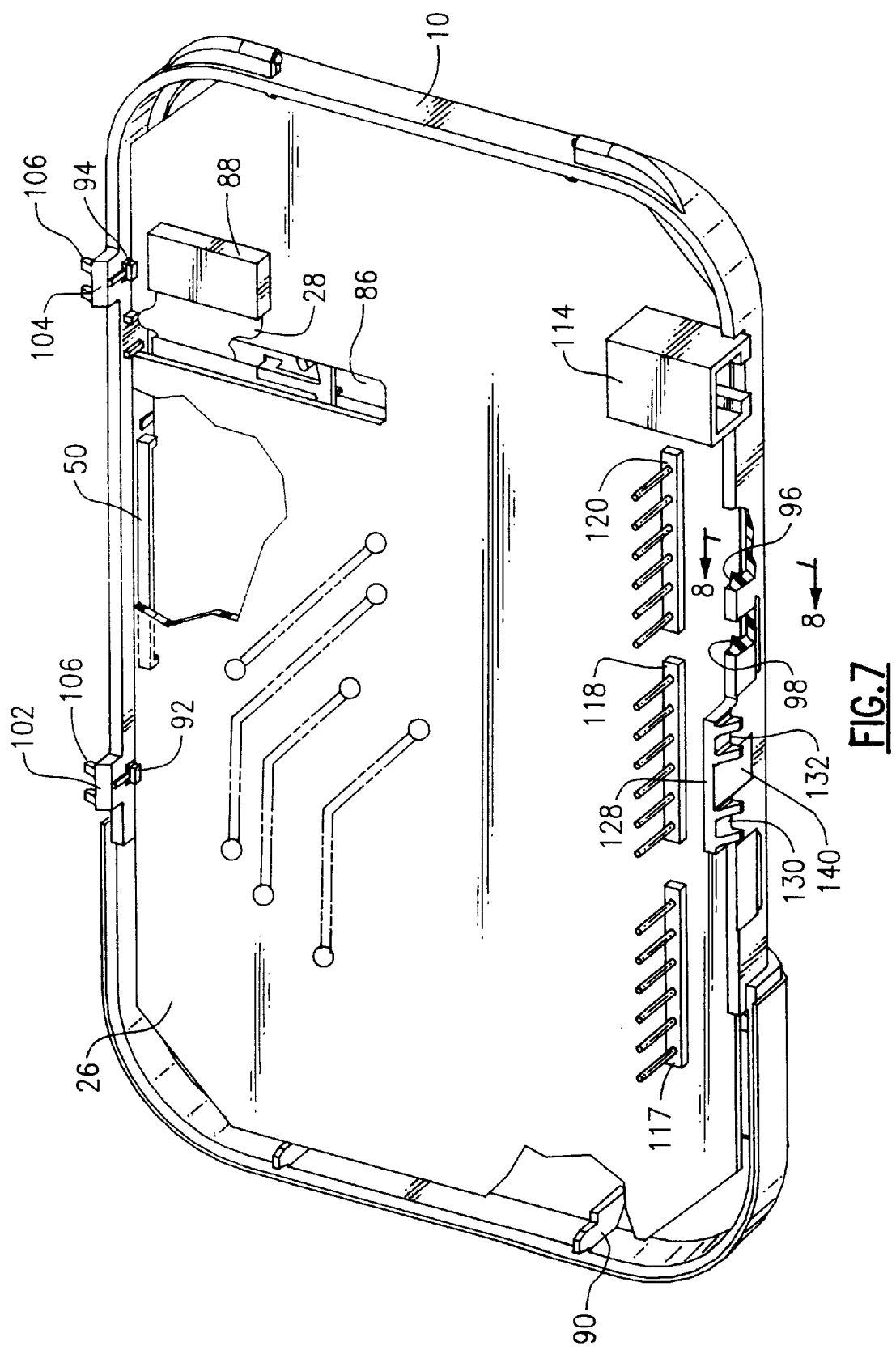
FIG. 7 illustrates the registration of the printed circuit board with respect to the front panel housing.

Referring now to FIG. 7, the printed circuit board 26 is illustrated in registered position with respect to the front panel housing 10. The ribbon cable connector 28 is furthermore fitted through a slot 86 in the circuit board so that it can be inserted into a connector 88 on the bottom or exposed side of the printed circuit board 26. The bottom surface of the printed circuit board rests on side supports such as 90 situated on the inner opposing sides of the front panel housing 10. There are preferably four such side supports. The bottom of the printed circuit board also rests on the shelf 50 whereas the opposing top of the printed circuit board fits snuggly underneath projections 92 and 94 extending inwardly from the side of the front panel housing 10 with the shelf 50. The printed circuit board is also captured underneath projections such as 96 and 98 which project inwardly from the opposite side of the front panel housing 10. There are preferably four such projections located along the opposite side of the front panel housing. At least one additional support post 100, as shown in FIG. 2, supports the printed circuit board in the vicinity of the projections such as 96 and 98. The bottom of the printed circuit board should be supported by the support 100 at the same level established by the shelf 50. Referring to FIG. 8, the height of the upwardly extending pillar support 100 is such as to support the bottom of the printed circuit board 26 when the top of the printed circuit board is snapped into position underneath the extending projections such as 96. It is to be appreciated that the electrically conductive pads on the underside of the printed circuit board, which is not shown in FIG. 7, will be in registration with the bottoms of the elevated casings such as 78 and 80 of the keyboard unit 12 when the printed circuit board is snapped into place .

Referring now to FIGS. 1 and 7, the assembled elements within the front panel housing 10 are now ready to be registered with respect to the rear housing 34. It is to be appreciated that the display 12, keyboard 14 and printed circuit board 26 will preferably have been assembled into the front panel housing during a manufacturing process. This will result in the assembled elements within the front panel housing being ready for the final assembly step, as will now be discussed.

Referring to the rear housing 34 in FIG. 1, it is to be appreciated that this housing will normally be attached to a wall via threaded fasteners inserted through mounting holes such as 36 and 37. The front panel housing 10, as shown in FIG. 7 with assembled display, keyboard and printed circuit board therein, will be attached to the thus mounted rear housing 34. In particular, front panel housing tabs 102 and 104 having tooth-like projections such as 106 are inserted into rear housing receptacles 108 and 110 so that the tooth-like projections such as 106 engage rectangular shaped vent holes such as 112 formed in the rear housing 34. A guide 114 on the printed circuit board 26 which serves to locate the printed circuit board when initially assembled into the front panel housing 10 also engages a correspondingly shaped notch 116 in the rear housing 34. Pronged extensions 117, 118 and 120 are inserted into the receiving receptacles 122, 124 and 126 in the rear housing. Finally, a large front panel housing tab 128 having two individual sets of tooth-like projections 130 and 132 is inserted into a corresponding rear housing receptacle 134. The sets of tooth-like projections 130 and 132 engage rectangular-shaped vent holes such as 136 in the rear housing.

The large front panel housing tab 128 preferably includes a recess 140, which accommodates the blade of a screwdriver. The blade of the screwdriver can be inserted into the recess 140 while the tab 128 is in the receptacle 134. The thus inserted screw driver blade bends the large front housing tab 128 sufficiently so as to disengage the sets of tooth-like projections 130 and 132 from the rectangular-shaped vent holes such as 136 in the rear housing. When this occurs, the front panel housing can be removed from the rear housing 34.

It is to be appreciated that method and apparatus have been disclosed for assembling a wall mounted programmable control device such as a thermostat. It will be furthermore appreciated by those skilled in the art that changes could be made to the above described method and apparatus without departing from the scope of the invention. Accordingly, the foregoing description is by way of example only and the invention is to be limited only by the following claims and equivalents thereto.

What is claimed is:

1. A wall mounted control device comprising:

a rear housing to be mounted to a wall;

a front housing mounted to said rear housing;

a display located within said front housing so as to display information that is viewable through an opening in said front housing, said display being maintained within said front housing by at least one latch which is movable to a first position so as to allow for the positioning of said display within said front housing and movable to a second position for maintaining said display in position;

a keyboard unit located within said front housing on a plurality of support pillars formed in said front housing, said keyboard unit having a plurality of depressible keys extending into delineated openings within said front housing; and a printed circuit board maintained within said front housing by a plurality of projections in the periphery of said front housing, said projections extending inwardly from the periphery of said front housing.

2. The wall mounted control device of claim 1 wherein said front panel housing further comprises:

a plurality of supports formed in said front panel housing for supporting said printed circuit board below said plurality of inwardly extending projections from the periphery of said housing, whereby said printed circuit board is firmly affixed between said supports formed in said front panel housing and said plurality of inwardly extending projections.

3. The wall mounted control device of claim 1 wherein said printed circuit board comprises a plurality of electrically conductive pads located below said plurality of depressible keys when said printed circuit board is maintained within said front housing by said plurality of projections extending inwardly from the periphery of said housing.

4. The wall mounted control device of claim 1 further comprising:

a plurality of aligning projections formed in said front housing at locations around the opening in said front housing for viewing displayed information on said display.

5. The wall mounted control device of claim 1 wherein said latch comprises:

a post extending upwardly from the back surface of said front housing; and an arm extending outwardly from said upwardly extending post, said arm having a tab extending downwardly toward the back surface of said front housing, said tab engaging an edge of the display so as to maintain said display in place relative to said aligning projections formed in said front housing.

6. The wall mounted control device of claim 1 wherein said latch comprises:

a post extending upwardly from the underside of said front panel housing; and an "L" shaped top portion wherein a first leg of the "L" shaped top portion is rigidly affixed at one end to said post and wherein the second leg of the "L" shaped top portion may be engaged by a human finger so as to bend the first leg of the "L" shaped top portion relative to the post extending upwardly from the underside of said front panel housing.

7. The wall mounted control device of claim 1 wherein said keyboard unit further comprises:

at least one tab cantilevered from the main body of said keyboard unit so as to extend outwardly over the back side of said display, said cantilevered tab being biased against the backside of said display so as to maintain said display in place relative to said aligning projections formed in said front housing.

8. The wall mounted control device of claim 1 wherein said front panel housing comprises:

at least one movable tab formed in the periphery of said front panel housing, said movable tab engaging the periphery of said rear housing when said front panel housing is mounted to said rear panel housing, said movable tab having a recess formed therein so as to receive an end of a tool so as to disengage the movable tab from the periphery of said rear housing.

9. The wall mounted control device of claim 4 wherein said plurality of aligning projections comprises:

at least one corner shaped projection formed in said front housing for receiving a corner of the display; and at least one edge alignment projection formed in said housing for receiving and aligning one edge of said display.

10. The wall mounted control device of claim 5 wherein said movable latch further comprises:

a leg connected to said arm; at an angle with respect to said arm so as to extend away from the tab extending downwardly from said arm, said leg being of sufficient length so as to receive the force of a human finger sufficient to bend the arm of said latch thereby disengaging said downwardly extending tab from engaging the edge of the display.

11. The wall mounted control device of claim 6 wherein furthermore comprising:

edge aligning tab extending downwardly from said top "L" shaped portion so as to normally be in contact with an edge of the display unless said first leg of said "L" shaped top portion is bent due to said second leg of said L-shaped portion being engaged by a human finger.

12. The wall mounted control device of claim 10 further comprising:

a stop formed on the underside of said front housing for stopping the bending of said arm due to a human finger pressing against the leg extending at an angle away from said arm.

13. A process for assembling a display, a keyboard unit, and a printed circuit board relative to a front housing of a wall mounted control device, said process comprising:

aligning the display with respect to a plurality of projections extending upwardly from the front housing;

latching said aligned display into place with respect to said plurality of projections extending upwardly from the front housing;

positioning the keyboard unit with respect to a plurality of delineated openings in said front housing for receiving depressible keys on said keyboard unit; and mounting a printed circuit board having electrically conductive pads thereon, within said front housing, said printed circuit board being maintained within said front housing by a plurality of projections extending from the periphery of said front housing whereby the electrically conductive pads on the printed circuit board are located directly beneath the depressible keys of the keyboard unit.

14. The process of claim 13 wherein said step of latching said aligned display into place with respect to said plurality of projections extending upwardly from the front housing comprising:

moving a latch formed on said housing so as to engage an edge of the display.

15. The process of claim 13 wherein said step of aligning the display with respect to a plurality of projections extending upwardly from the front housing comprises:

positioning at least one corner of the display with respect to a corner shaped projection on said front housing; and positioning at least one edge relative to an edge aligning projections.

* * * * *